(12) United States Patent
Gehring et al.

(10) Patent No.: US 6,842,710 B1
(45) Date of Patent: Jan. 11, 2005

(54) CALIBRATION OF INTEGRATED CIRCUIT TIME CONSTANTS

(75) Inventors: Mark Richard Gehring, Portland, OR (US); Brent R. Jensen, Portland, OR (US)

(73) Assignee: Cypress Semiconductor Corporation, San Jose, CA (US)

( * ) Notice: Subject to any disclaimer, the term of this patent is extended or adjusted under 35 U.S.C. 154(b) by 91 days.

(21) Appl. No.: 10/226,911

(22) Filed: Aug. 22, 2002

(51) Int. Cl.$^7$ ............................................. G01R 35/00
(52) U.S. Cl. ...................... 702/107; 324/601; 324/711; 327/344; 327/337
(58) Field of Search ........................... 702/107, 85, 65; 324/601, 615, 658, 711; 327/344, 337

(56) References Cited

U.S. PATENT DOCUMENTS

| | | | | |
|---|---|---|---|---|
| 5,398,261 A | * | 3/1995 | Marbot | 375/257 |
| 5,625,316 A | * | 4/1997 | Chambers et al. | 327/553 |
| 5,914,633 A | * | 6/1999 | Comino et al. | 327/553 |
| 6,628,163 B2 | * | 9/2003 | Dathe et al. | 327/553 |
| 6,677,814 B2 | * | 1/2004 | Low et al. | 327/554 |
| 2004/0000926 A1 | * | 1/2004 | Ooshita | 326/30 |

OTHER PUBLICATIONS

Durham et al., "Integrated Continuous–Time Balanced Filters for 16–bit DSP Interfaces", IEEE, 1993.*
Durham et al., "Circuit Architectures for High Linearity Monolithic Continous–Time Filtering", IEEE, 1992.*
Durham et al., "High–Linearity Continuous–Time Filter in 5–V VLSI CMOS", IEEE, 1992.*

* cited by examiner

Primary Examiner—Patrick Assouad
(74) Attorney, Agent, or Firm—Wagner, Murabito, & Hao LLP

(57) ABSTRACT

A method and system for calibrating a time constant within an integrated circuit. A voltage storage element is charged, and the time required to achieve a reference voltage on the storage element is measured. The measured time is compared to a desired time. It necessary, an adjustable impedance is modified to change the charging time, and the cycle may be repeated until the charging time matches the desired time. In this novel manner, an actual RC time constant, as rendered in a particular integrated circuit, is measured and potentially adjusted to match a desired time constant. Advantageously, configuration information of the adjustable impedance may be communicated to other circuitry within the integrated circuit to enable such circuitry to implement the same RC time constant in analog signal processing. Consequently, embodiments of the present invention overcome incidences of wide tolerance in passive components implemented in integrated circuits. Beneficially, no external test equipment is required.

21 Claims, 7 Drawing Sheets

CALIBRATION OF INTEGRATED CIRCUIT TIME CONSTANTS

FIELD OF THE INVENTION

Embodiments of the present invention generally relate to the field of integrated circuit design. More specifically, embodiments of the present invention pertain to calibration of integrated circuit time constants.

BACKGROUND ART

It is generally highly desirable to include all elements of an electronic design for mass production into as few integrated circuits as possible. The benefits of such integration are well known and numerous, including, for example, lower parts cost, smaller size, lower manufacturing cost for a final product, higher reliability and greater function. Such benefits are realized whether the function to be integrated is primarily digital or of an analog nature.

Unfortunately, the integration into integrated circuits, ICs, of many analog functions, for example filters, analog timers, FM detectors and the like, suffers in practice from a well known deficiency of most integrated circuit manufacturing processes. Basic analog components, for example resistors and capacitors, of sufficient accuracy for many analog design purposes, are not generally manufacturable within an integrated circuit. More specifically, many such components typically have a tolerance of plus or minus 30 percent from their nominal values due to manufacturing process variation when rendered in an integrated circuit.

There have been numerous approaches employed in the prior art to overcome such limitations. For example, it is common to use accurate off-chip components, such as resistors and capacitors, in designs requiring accurate values for such components. The off-chip components typically may have much greater accuracy than on-chip components. For example, discrete resistors with one percent tolerance are commonly available, though they cost more than "standard" components, e.g., components with tolerances of plus or minus 10 percent. Although integrated circuit designers strive to require few off-chip components, those that are required cost more than the equivalent implementation on an IC, require additional manufacturing steps and increase the size of a final product. In addition, external components and the additional manufacturing process steps required to place them in an assembly reduce reliability and manufacturing yield.

Another common prior art approach to overcome the accuracy limitations of on-chip components is to utilize off-chip adjustable components. Such adjustable components are commonly used in radio frequency designs. The use of off-chip adjustable components is even less desirable than using off-chip discrete components, because adjustable components tend to be larger and require an additional manufacturing process step, and frequently expensive manufacturing test equipment, to make the adjustment. Nevertheless, off-chip adjustable components are widely used in conjunction with integrated circuits in electronic assemblies.

Yet another well known approach to overcome the accuracy limitations of on-chip components is illustrated in FIG. 1A (conventional art). The circuit 100 depicted in FIG. 1A uses a phase locked loop (PLL) to set filter frequencies, with the filter frequencies based on values of on-chip resistors and capacitors.

The frequency of the voltage-controlled oscillator (VCO) 110 is proportional to the transconductance, gm. The nominal value of gm, and hence the nominal VCO frequency is set by on-chip resistance. The PLL acts to adjust the on-chip resistance such that the product of R times C matches the desired value, e.g., an RC constant that is proportional to the crystal oscillator frequency. The PLL locks when the frequency of the VCO equals the crystal oscillator frequency. The control voltage 120 for the VCO is then used to set the gm value of other circuits, e.g. filter 130, on the IC in order to set their frequencies. Since the crystal oscillator provides a very accurate frequency (based on physical properties of the crystal), the variation of the on-chip RC value is corrected.

Unfortunately, this approach has several drawbacks. First, this method requires the design of a complicated PLL system. It will produce spurious signals from the phase detector, which can introduce deleterious signals into subsequent circuits. In addition, it has undesirable power consumption as it must be active at all times. Further, this circuit requires variable transconductance elements and is not widely applicable to a variety of applications, such as op-amp based filters. This method also requires a voltage controlled oscillator whose output signals can interfere with sensitive on-chip circuitry.

Still another well known approach to overcome the accuracy limitations of n-chip components is illustrated in FIG. 1B (conventional art). The circuit 150 depicted in FIG. 1B uses a frequency locked loop (FLL) to set filter frequencies, with the filter frequencies based on values of on-chip resistors and capacitors.

On-chip resistance sets the nominal value of gm. The FLL acts to adjust that resistance such that the product of R times C matches the desired value, e.g., an RC constant that is proportional to the crystal oscillator frequency. The FLL locks when the 90 degree phase shifter center frequency equals the crystal oscillator frequency. The control voltage 170 for the phase shifter is then used to set the gm value of other circuits, e.g., filter 180, on the IC in order to set their frequencies. Since the crystal oscillator provides a very accurate frequency (based on physical properties of the crystal), the variation of the on-chip RC value is corrected.

Unfortunately, this approach also has several drawbacks, similar to the previously described PLL circuit. First, this method requires the design of a complicated FLL system. It will produce spurious signals from the phase detector, which can introduce deleterious signals into subsequent circuits. In addition, it has undesirable power consumption as it must be active at all times. Further, this circuit requires variable transconductance elements and is not widely applicable to a variety of applications, such as op-amp based filters.

An additional well known approach to overcome the accuracy limitations of on-chip components is to adjust on-chip components for accuracy, for example by laser-trimming them. Adjustment processes such as laser trimming can produce highly accurate components, but the process is generally complex, time-consuming and expensive, requiring additional manufacturing process steps and expensive calibration and processing tools. The integrated circuit itself is also typically larger to allow for adjustable structures and room for the adjustments themselves, resulting in a higher cost for the bare integrated circuit with adjustable analog components, in addition to the increased manufacturing costs due to the adjustment itself.

Unfortunately, for a substantial class of applications, for example radio frequency filters, analog timers, FM detectors and the like, existing approaches to overcome the known large tolerance problems with analog component values within integrated circuits are not commercially acceptable to many IC manufacturers.

SUMMARY OF THE INVENTION

Thus a need exists for calibration of integrated circuit time constants. In conjunction with the aforementioned need, a further need exists for a calibration circuit which requires no external components. A still further need exists for meeting the previously identified needs with a method and system which are compatible with existing semiconductor designs and does not require the design of new semiconductor structures or manufacturing processes.

A method and system for calibrating a time constant within an integrated circuit are disclosed. A voltage storage element is charged, and the time required to achieve a reference voltage on the storage element is measured. The measured time is compared to a desired time. If necessary, an adjustable impedance is modified to change the charging time, and the cycle may be repeated until the charging time matches the desired time. In this novel manner, an actual RC time constant, as rendered in a particular integrated circuit, is measured and potentially adjusted to match a desired time constant. Advantageously, configuration information of the adjustable impedance may be communicated to other circuitry within the integrated circuit to enable such circuitry to implement the same RC time constant in analog signal processing. Consequently, embodiments of the present invention overcome the well known wide tolerance of passive components implemented in integrated circuits. Beneficially, no external test equipment is required.

Therefore, these and other objects and advantages of the present invention will become obvious to those of ordinary skill in the art after having read the following detailed description of the embodiments that are illustrated in the various drawing figures.

DETAILED DESCRIPTION OF THE INVENTION

In the following detailed description of the present invention, calibration of integrated circuit time constants, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Calibration of Integrated Circuit Time Constants

The present invention is described in the context of filter design on integrated circuits. However, it is appreciated that the present invention may be utilized in other types of electronics, including discrete components, where it may be necessary or desirable to accurately establish time constants.

Figure 1A:
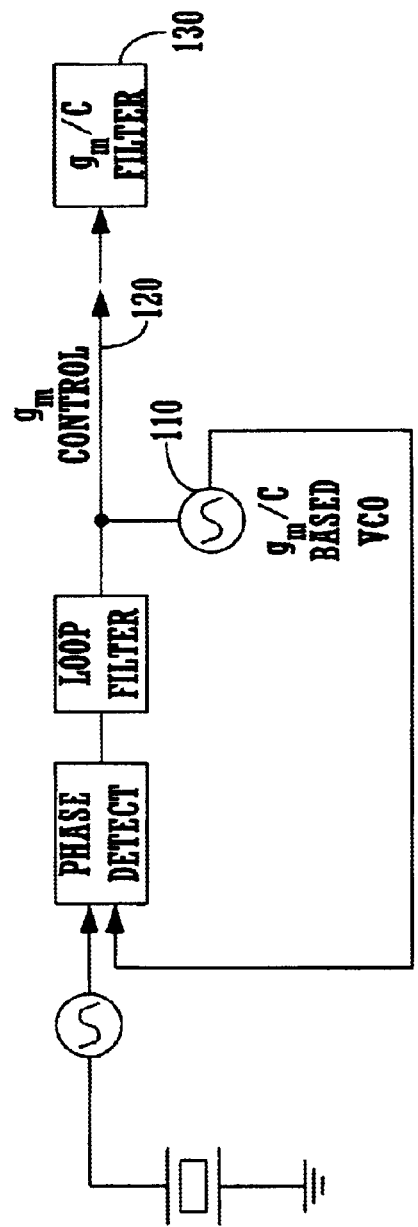
FIG. 1A illustrates a circuit using a phase locked loop (PLL) to set filter frequencies as is known in the conventional art.
Figure 1B:
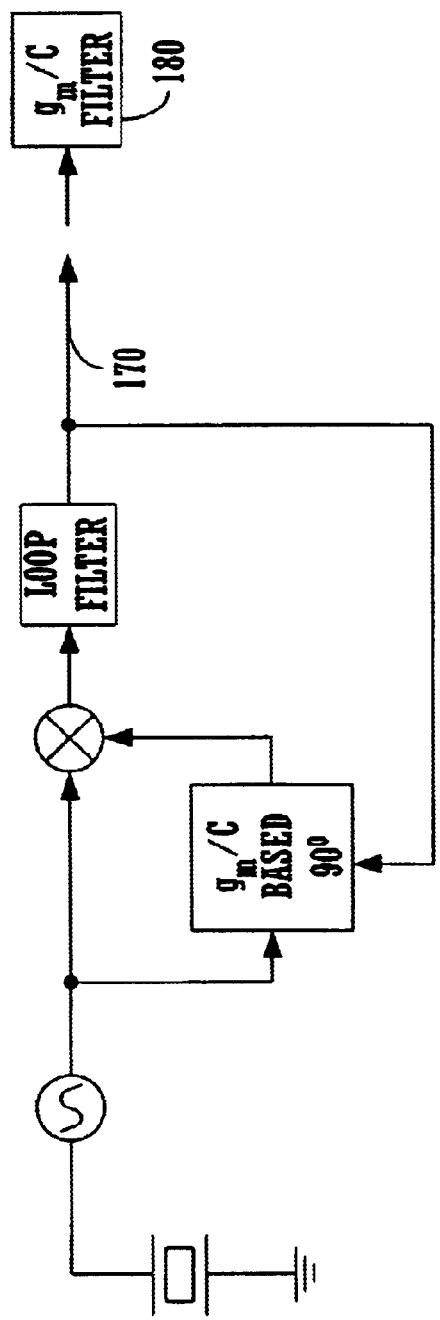
FIG. 1B illustrates a circuit using a frequency locked loop (FLL) to set filter frequencies as is known in the conventional art.
Figure 2:
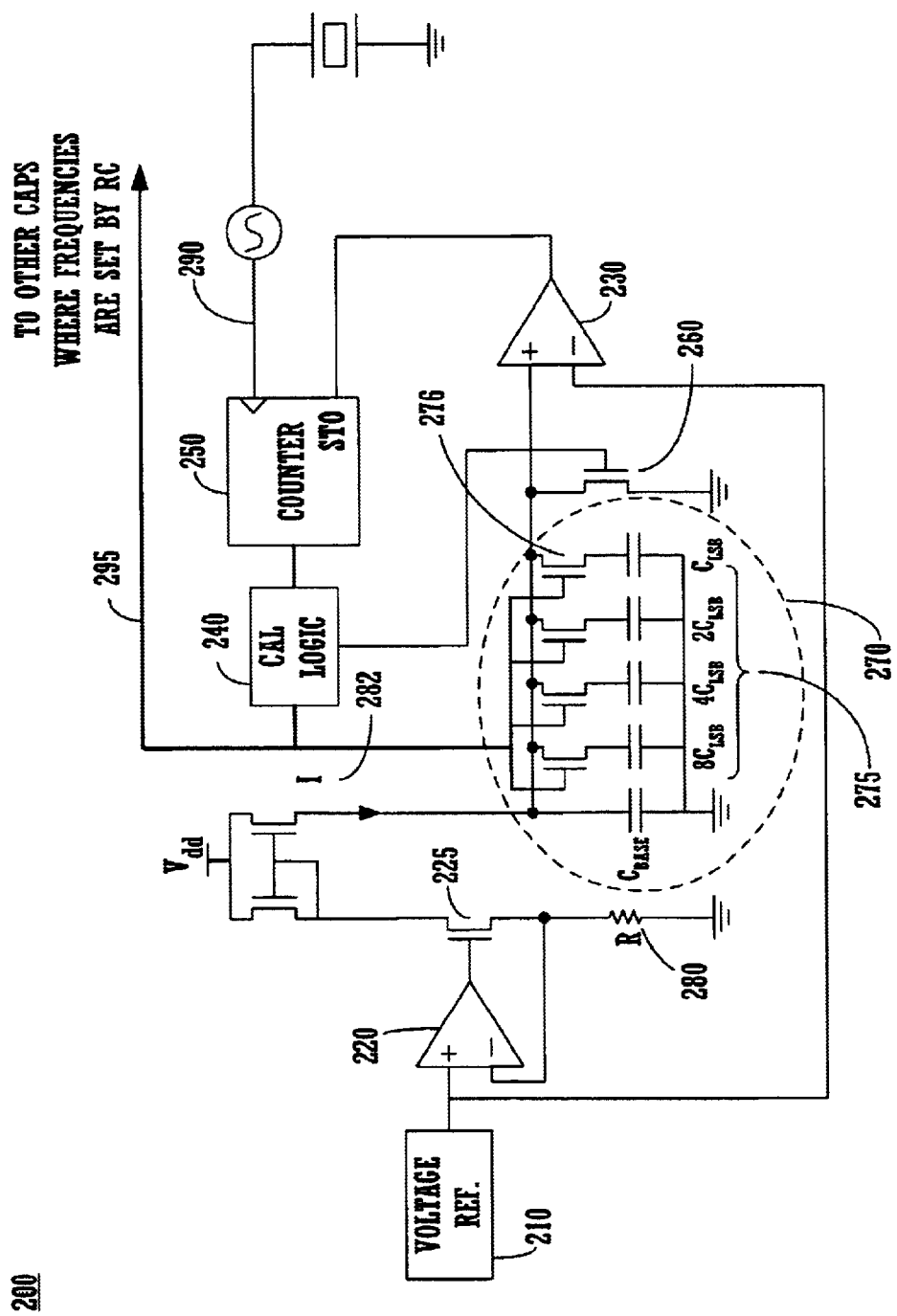
FIG. 2 illustrates a circuit to calibrate an integrated circuit time constant, according to an embodiment of the present invention.

FIG. 2 illustrates a circuit 200 which may be used to calibrate an integrated circuit time constant, according to an embodiment of the present invention.

In the exemplary circuit 200 shown, a voltage reference 210 is used to create a current I 282 proportional to R, the resistance value of resistor R 280, using operation amplifier 220, transistor 225 and resistor R 280. It is to be appreciated that voltage reference 210 need not be specific and/or dedicated to calibration circuit 200. Rather, voltage reference 210 may substantially be any convenient voltage available on an IC. As will be shown below with respect to relation 1, voltage reference 210 does not need to be a specific value. Preferably, the voltage is chosen to work well with comparator 230. Voltage reference 210 may be provided from off-chip or from an on-chip source.

It is appreciated that current I 282 is then used to charge a capacitor. The time required to charge a capacitor to any multiple of the reference voltage is given by:

$$T_{RC} = C*k*V_{REF}/I \qquad \text{(relation 1)}$$
$$= C*k*V_{REF}/(V_{REF}/R)$$
$$= k*RC$$

From relation 1 above it may be seen that the charging time is dependent only on the RC product. More specifically, the reference voltage cancels out of the expression.

According to an embodiment of the present invention, the capacitor to be charged may be comprised of a base capacitor and a plurality of adjustment capacitors 275 which may be trimmed in or out as needed. It is appreciated that embodiments of the present invention are well suited to the absence of a base capacitor. Adjustment capacitors 275 may be selectively combined or removed electrically from capacitor 270 by a controllable switch associated with each element of adjustment capacitors 275, for example switches 276. The combination of the base capacitor and the adjustment capacitors are collectively referred to as capacitor 270. Although the capacitive elements of capacitor 270 are shown in a parallel circuit arrangement, it is appreciated that embodiments of the present invention are well suited to a series arrangement of capacitive elements as well as combination parallel and series arrangements. It is to be further appreciated that references herein to "capacitors" and "resistors" rendered within integrated circuits generally refer to a variety of well known implementations of semiconductor structures which implement components with substantially capacitive and/or resistive behavior.

Preferably, the adjustment capacitors 275 are arranged such that their nominal values have a binary relationship to one another. For example, if the smallest adjustment capacitor value is $C_{LSB}$, then other adjustment capacitor nominal values should be $2C_{LSB}$, $4C_{LSB}$, $8C_{LSB}$ etc. This arrangement of adjustment capacitor values allows for straight-forward combining of adjustment capacitor values to produce integer multiples of the smallest adjustment capacitor value, $C_{LSB}$. It is to be appreciated that embodiments of the present invention are well suited to other arrangements of adjustment capacitors, for example fewer or more adjustment capacitors and/or a different weighting system, e.g., a 10× relationship between nominal values.

To perform a calibration of a time constant, initially the capacitor 270 voltage is set to zero, according to an embodiment of the present invention. Switching device 260 may participate in this function by shorting capacitor 270 to ground in order to initialize this value. Subsequently, capacitor 270 is allowed to charge and counter 250 begins counting time units.

It is to be appreciated that clock signal 290 need not be produced as a part of circuit 200 nor dedicated to circuit 200. As has been discussed previously with respect to reference voltage 210, a highly accurate frequency reference is not required by embodiments of the present invention. Rather, beneficial improvements may be derived from a clock which is more consistent than manufacturing tolerances of passive components, e.g., +/−30 percent.

When the voltage across capacitor 270 is substantially equal to voltage reverence 210, comparator 230 signals counter 250 to cease counting. The value of counter 250 is compared by calibration logic 240 to a desired value. If the value of counter 250 is not within a threshold value of the desired value, calibration logic 240 modifies the capacitance value of adjustment capacitors 275 by modifying the settings of switches 276, and initiates the charging, counting and comparison again.

Preferably, calibration logic 240 implements a binary search or successive approximation to determine a combination of elements of adjustment capacitor 275 which most closely produces a desired count value. For example, for a first trial, the capacitive element corresponding to a most significant bit value may be switched into adjustment capacitor 275, and all other capacitive elements are switched out. If the count is below the desired count value, then more capacitance is needed and the next most significant bit value may be switched in. Subsequently, the charging, counting and comparing is repeated.

If the count is above the desired count value, then less capacitance is needed. The previous bit value may be switched off and the next most significant bit value may be switched in. Subsequently, the charging, counting and comparing is repeated.

When a final count value is within a threshold value of the desired value, calibration of a time constant is complete. Calibration logic 240 subsequently provides information of the adjustment capacitor switch settings to other on-chip circuitry via signal path 295.

It is to be appreciated that calibration logic 240 and counter 250 are well suited to a wide variety of embodiments of the present invention. For example, calibration logic 240 may be a dedicated state machine, or may be implemented within a microprocessor. Likewise, signal path 295 may be used for serial communication, it may be a dedicated bus, or it may be a portion of a microprocessor system.

It is to be appreciated that a calibration sequence may be terminated whenever a count exceeds a threshold above a desired count value, according to an embodiment of the present invention. When this happens, it is an indication of too much capacitance. Less capacitance is needed. The previous bit value may be switched off and the next most significant bit value may be switched in. Subsequently, the charging, counting and comparing is repeated without waiting for capacitor 270 to fully charge.

It is to be further appreciated that other approximation strategies are well suited to embodiments of the present invention. For example, calibration logic 240 may interpolate a combination of capacitive elements based upon a relationship between changes in switch settings and changes in count values.

Figure 3:
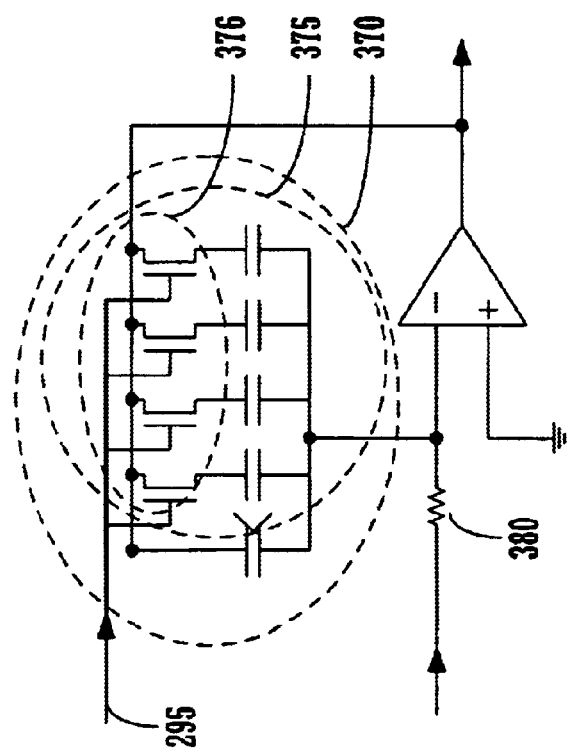
FIG. 3 depicts an exemplary circuit which employs calibration information obtained from a time constant calibration circuit, according to an embodiment of the present invention.

FIG. 3 depicts an exemplary circuit 300 which employs calibration information obtained from time constant calibration circuit 200, according to an embodiment of the present invention.

Circuit 300 is an operational amplifier filter. Resistor 380 and capacitor 370 determine the frequency of operation. As described in FIG. 2 above, capacitor 370 may be comprised of a base capacitor and a plurality of adjustment capacitors 375. Adjustment capacitors 375 may be selectively combined or removed electrically from capacitor 370 by a switch associated with each element of adjustment capacitors 375, for example switches 376. The combination of the base capacitor and the adjustment capacitors are collectively referred to as capacitor 370. Although the capacitive elements of capacitor 370 are shown in a parallel circuit arrangement, it is appreciated that embodiments of the present invention are well suited to a series arrangement of capacitive elements as well as combination parallel and series arrangements. It is further appreciated that the arrangement of the individual elements of capacitor 370 preferably corresponds to the arrangement of the individual elements of capacitor 270 of FIG. 2. Similarly, resistor 380 is preferably constructed analogously to resistor 280.

It is well known that devices on the same integrated circuit may be constructed with great symmetry. For example, two capacitive elements of the same size and shape constructed within a common IC will have nearly identical capacitance. Consequently, by utilizing similar capacitive structures within time constant calibration circuit 200 (FIG. 2) and exemplary circuit 300, a nearly identical capacitance value may be obtained by utilizing corresponding switch settings for the selectable adjustment capacitors.

As described above, the switch settings may be determined such that the combination of capacitor 270 and resistor 280 (FIG. 2) have a desired RC time constant. By setting the switches for capacitor 375 to the same pattern, capacitor 370 and resistor 380 may beneficially have the same RC time constant, and, for example, filter circuit 300 may operate at a desired frequency.

It is to be appreciated that embodiments of the present invention do not implement a "switched capacitor" filter, as is well known in the conventional art. In a "switched capacitor" filter, the capacitors are switched substantially continuously during operation. While embodiments of the present invention may employ switchable capacitors, the switches are used for configuration, and remain static during operation, producing a constant capacitive value.

Figure 4A:
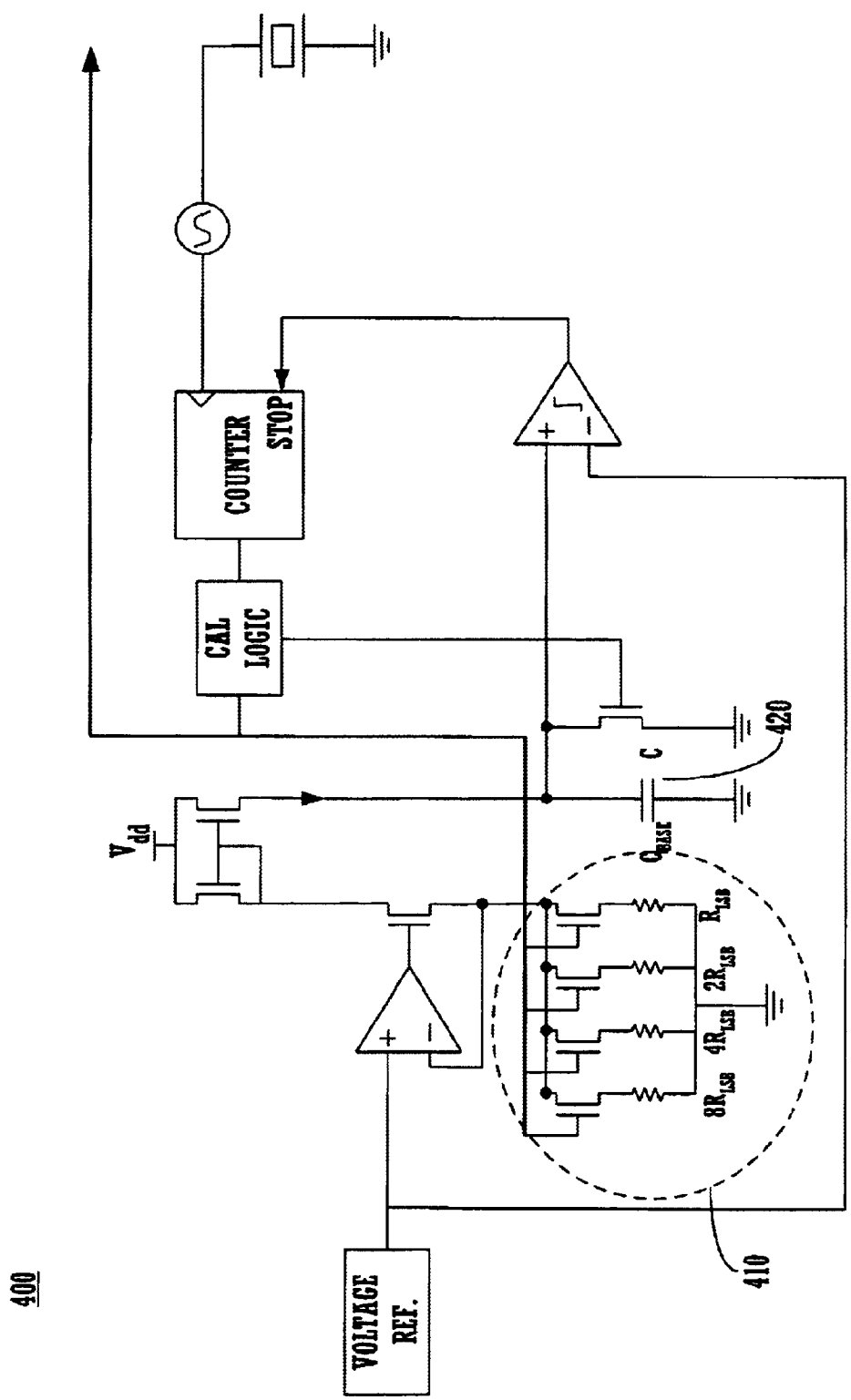
FIG. 4A and FIG. 4B illustrate an alternative embodiment of the present invention.
Figure 4B:
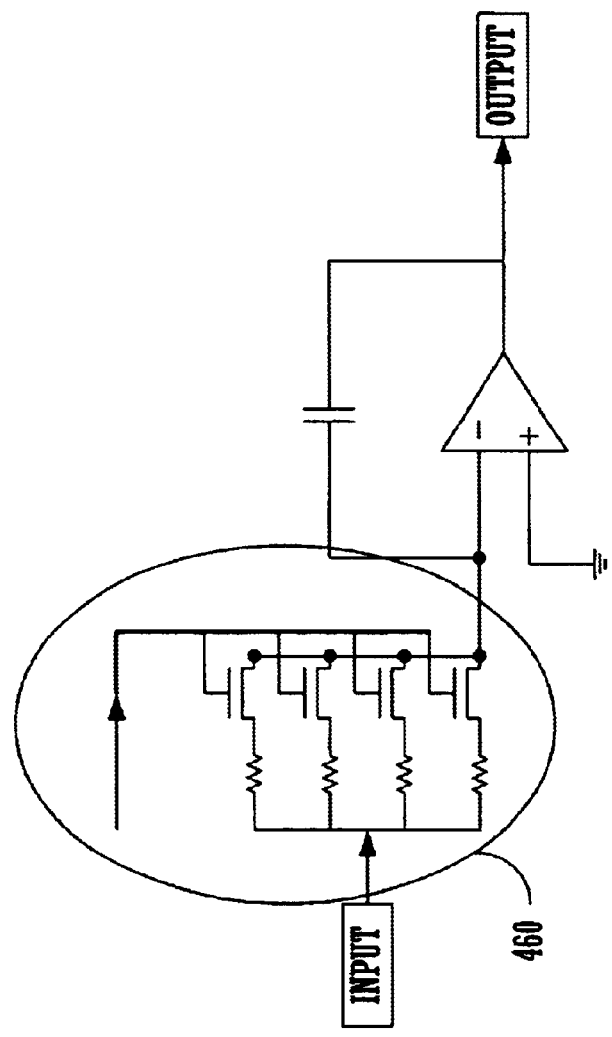

FIG. 4A and FIG. 4B illustrate alternative embodiments of the present invention. Calibration circuit 400 of FIG. 4A is analogous to calibration circuit 200 (FIG. 2) with the roles of resistors and capacitors interchanged. Calibration circuit 200 has a fixed resistor and variable capacitance. Calibration circuit 400 has a fixed capacitor and variable resistance. The operation of calibration circuit 400 may be similar to the operation of calibration circuit 200. The charging of capacitor 420 is timed, and the resistance of variable resistance 410 is adjusted until the capacitor 420 is charged in a desired amount of time. It is to be appreciated that embodiments of the present invention are well suited to the use of an unswitched base resistor in combination with switchable resistors.

FIG. 4B depicts an exemplary circuit 450 which employs calibration information obtained from time constant calibration circuit 400, according to an embodiment of the present invention. Variable resistance 460 is arranged to be similar to variable resistance 410. Due to the inherent symmetry available on an integrated circuit, variable resistance can be configured via switch settings to provide a substantially identical resistance values as those of variable resistance 410 of FIG. 4A.

As described above, the switch settings may be determined such that the combination of capacitor 420 and resistor 410 (FIG. 4A) have a desired RC time constant. By setting the switches for resistor 460 to the same pattern, capacitor 420 and resistor 410 may beneficially have the same RC time constant, and, for example, filter circuit 450 may operate at a desired frequency.

Figure 5:
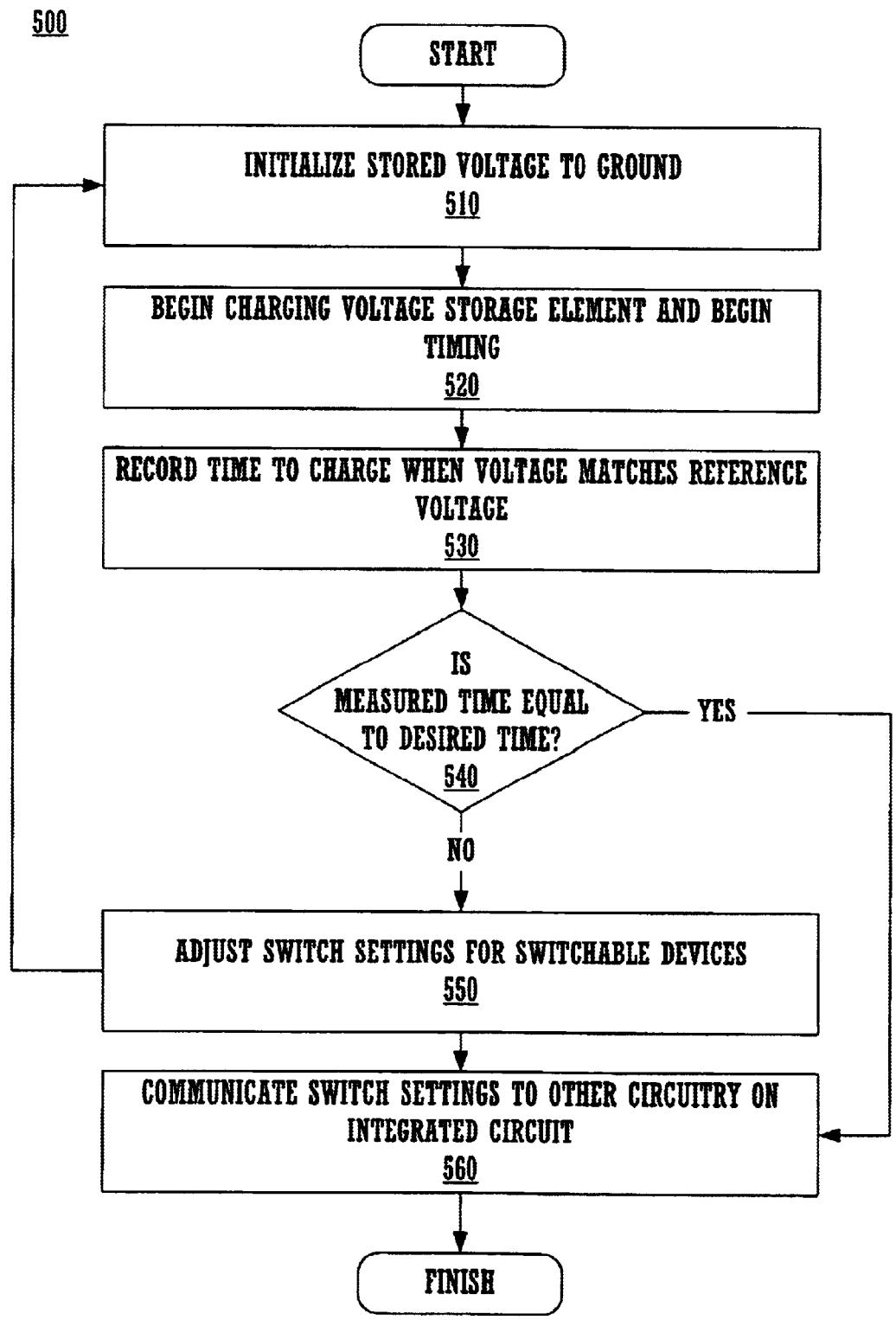
FIG. 5 is a flow diagram illustrating a process for calibrating a time constant on an integrated circuit, according to an embodiment of the present invention.

FIG. 5 illustrates a process 500 for calibrating a time constant on an integrated circuit, according to an embodiment of the present invention.

In optional step 510, a voltage stored on a voltage storage element, for example capacitor 270 of FIG. 2, may be initialized to be substantially ground.

In step 520, charging of a voltage storage element and timing of the charging is begun. In step 530, the time required to charge the voltage storage element is recorded, for example as a register value in counter 250 of FIG. 2. Completion of charge may be indicated, for example, by comparator 230 of FIG. 2.

In decision step 540, the measured charging time is compared to a desired time. If the times are equal process flow continues at optional step 560. It is appreciated that an exact timing match may not be required. A timing value within a threshold value (difference) of the desired value may be sufficient for some embodiments of the present invention. The use of a threshold comparison, for example, "that's close enough," may speed calibration and reduce jitter, for example, in a case where exact time matches can not be obtained.

If the times are unequal, or differ by more than a threshold value, then process flow continues at step 550. In step 550, switch settings are modified to produce a different time constant. If the count is below the desired count value, then more capacitance or resistance is needed and the next most significant bit value may be switched in. If the count is above the desired count value, then less resistance or capacitance is needed and the previous bit value is switched off, and the next most significant bit value may be switched in.

As described previously, many methods for guiding the changes to adjustable values are well suited to embodiments of the present invention. Subsequent to the adjustment(s) of step 550, process flow continues at optional step 510, or at step 520 if 510 is not present.

In optional step 560, switch settings of adjustable components are communicated, for example via signal path 295 of FIG. 2, to other circuitry on the integrated circuit, for example exemplary filter circuit 300 of FIG. 3.

According to an alternative embodiment of the present invention, a known resistance value, e.g., a laser trimmed on-chip resistor or a high precision off chip resistor, may be used to not only calibrate a time constant, but also to accurately measure an on-chip capacitance. It is appreciated that individual on-chip capacitors are typically not adjustable, e.g., by laser trimming processes. Such a method may be used to reduce a number of precision resistors which must be used or trimmed. A set of switchable on-chip capacitors, e.g., adjustable capacitor 275 of FIG. 2, could additionally be set to a specific value of capacitance. Analogously, a known capacitance value, e.g., a calibrated adjustable external capacitor, could be used to set or measure an on-chip resistance value.

This novel method of calibration has numerous advantages over the prior art. One desirable advantage is that no off-chip components are required, as suitable voltages and frequencies are typically available from other functional modules of an IC. As has been discussed previously, highly accurate voltage and frequency references are not required by embodiments of the present invention. Beneficial improvements may be derived from references which are more accurate than manufacturing tolerances of passive components, e.g., +/−30 percent. This enables beneficial reductions in circuit volume, component cost and manufacturing steps, and an advantageous increase in reliability due to the corresponding reductions in component count and manufacturing steps.

A second benefit is that embodiments of the present invention enable filters to be constructed from operational amplifiers as opposed to transconductance or "gm-C" filters. When compared to "gm-C" filters, operational amplifiers are much more linear and generally lower current consumption. Further, current consumption does not vary as with "gm-C" designs, allowing for better prediction of power consumption characteristics.

Another highly desirable advantage is that neither external test equipment nor calibration process steps during manufacturing are required, as all measurements are performed internally to the IC. In many high volume electronic assemblies, assembly manufacturing cost is a significant part of the product cost structure. Consequently, reductions in manufacturing processing are highly beneficial.

Advantageously, the circuits employed by embodiments of the present invention may be turned off after the calibration is complete, as their output may be a bit pattern which may be stored in a variety of manners. By powering off a calibration circuit, energy consumption may be beneficially reduced. In addition, with calibration circuitry turned off it can not generate spurious signals which may deleteriously interfere with other processes on an integrated circuit.

In contrast to conventional art approaches involving precision devices, either on-chip or off-chip, or adjustable devices, embodiments of the present invention calibrate a time constant, which is a product of a resistance value multiplied by a capacitive value. This avoids a deleterious build up of tolerances. For example, if a resistor is adjusted to be within five percent of its nominal value and a capacitor is adjusted to be within five percent of its nominal value, then the RC product is within 10 percent of its nominal value. Embodiments of the present invention may be arbitrarily accurate, depending primarily on the granularity of the switchable devices and the accuracy and granularity of the timer.

Since the circuits employed by embodiments of the present invention are sequential in nature, no feedback loops (as in a PLL or FLL) need to be analyzed or designed. This may enable circuit designers of lesser skill to implement these designs, and/or it may allow these designs to be implemented more quickly with higher quality and a greater chance of first pass success.

The digital nature of the switch settings enables straightforward coupling to digital subsystems on an IC. The settings may be represented by bit values and stored, transmitted and manipulated in a variety of manners well known in the digital arts. Some conventional art approaches require the distribution of an analog signal, e.g., a gm control voltage, throughout a chip. Such analog signals are susceptible to deleterious noise that may interfere with the functioning of subsequent circuitry using the control signals.

An advantage of embodiments of the present invention is that the calibration may be performed at virtually any time. For example, a time constant may be calibrated in the final electronic assembly with all field influences present, as opposed to being calibrated with just a circuit board present. Such "anytime" calibration may also be employed "in the field," as a device is actually being used. This may allow a highly beneficial calibration under actual conditions. It is well known that resistance and capacitance values on ICs may change with temperature, and embodiments of the present invention may serve to mitigate the effect of such changes.

Embodiments of the present invention provide for calibration of integrated circuit time constants. Embodiments of the present invention further provide for a calibration circuit which requires no external components. Still further embodiments of the present invention provide for a method and apparatus which are compatible with existing semiconductor designs and does not require the creation of new semiconductor structures or manufacturing processes.

The preferred embodiment of the present invention, calibration of integrated circuit time constants, is thus described. While the present invention has been described in particular embodiments, it should be appreciated that the present invention should not be construed as limited by such embodiments, but rather construed according to the below claims.

What is claimed is:

1. A method of calibrating an integrated circuit time constant comprising:
    charging a voltage storage element on said integrated circuit;
    measuring a charge time required for a voltage of said voltage storage element to match a reference voltage;
    adjusting an impedance on said integrated circuit to make said charge time approximately equal to a desired time constant value, wherein said adjusting comprises successive approximation; and
    based on an adjustment configuration determined by said adjusting, configuring a second circuit on said integrated circuit to have substantially said desired time constant value.

2. The method of calibrating a time constant as described in claim 1 wherein said voltage storage element is a capacitive element.

3. The method of calibrating a time constant as described in claim 1 wherein said impedance comprises a plurality of substantially passive elements.

4. The method of calibrating a time constant as described in claim 3 wherein said plurality of substantially passive elements are selectively combinable to form a range of impedances.

5. The method of calibrating a time constant as described in claim 3 wherein said plurality of substantially passive elements comprise a binary sequence of element values.

6. The method of calibrating a time constant as described in claim 3 wherein said plurality of substantially passive elements are resistive.

7. The method of calibrating a time constant as described in claim 3 wherein said plurality of substantially passive elements are capacitive.

8. The method of calibrating a time constant as described in claim 1 wherein said measuring comprises incrementing a counter until said voltage stored on said voltage storage element matches a reference voltage.

9. The method of calibrating a time constant as described in claim 1 further comprising initializing a voltage stored on said voltage storage element to be substantially ground.

10. The method of calibrating a time constant as described in claim 9 further comprising repeating said initializing, charging, measuring and adjusting if said time is less than said desired time constant.

11. The method of claim 1 wherein said adjusting comprises switching a plurality of switchable capacitors to obtain said charge time.

12. An electronic circuit for calibrating a time constant comprising:
    a current source having a current output that is determined by a resistance and a voltage reference;
    a variable impedance coupled to said current source;
    a voltage storage element coupled to said current source for charging by said current source;
    a voltage comparator coupled to said voltage reference and to said voltage storage element for comparing a voltage of said voltage storage element to a voltage of said voltage reference;
    a counter coupled to said voltage comparator to measure the charge time required for said voltage of said voltage storage element to substantially equal said voltage of said voltage reference; and
    a circuit for adjusting said variable impedance until said charge time is substantially equal to a desired time constant, wherein said adjusting comprises successive approximation.

13. The electronic circuit as described in claim 12 further comprising a switch for initializing a voltage on said voltage storage element to be substantially ground.

14. The electronic circuit as described in claim 12 wherein said voltage storage element comprises said variable impedance.

15. The electronic circuit as described in claim 12 wherein said resistance comprises said variable impedance.

16. The electronic circuit as described in claim 12 wherein said variable impedance comprises a first plurality of substantially passive elements wherein said passive elements are selectively combinable to form a range of impedances.

17. The electronic circuit as described in claim 16 wherein said first plurality of substantially passive elements comprise a binary sequence of element values.

18. In an electronic circuit, a method of calibrating a time constant comprising:
    charging a voltage storage element of said electronic circuit;
    measuring a time required for a voltage of said voltage storage element to match a reference voltage as a charge time wherein said charge time is dependent on a impedance; and
    adjusting said impedance of said electronic circuit to make said charge time approximately equal a desired time constant, wherein said adjusting comprises successive approximation.

19. The method of calibrating a time constant as described in claim 18 wherein said impedance comprises a plurality of substantially passive elements.

20. The method of calibrating a time constant as described in claim 19 wherein said plurality of substantially passive elements are selectively combinable to form a range of impedances.

21. The electronic circuit as described in claim 16 wherein said successive approximation comprises sequentially switching elements of said variable impedance.

* * * * *